United States Patent [19]
Kim

[11] Patent Number: 6,146,796
[45] Date of Patent: Nov. 14, 2000

[54] LIQUID CRYSTAL DISPLAY AND A MANUFACTURING METHOD THEREOF

[75] Inventor: Dong-Gyu Kim, Kyungki-do, Rep. of Korea

[73] Assignee: Samsung Electronics Co., Ltd., Seoul, Rep. of Korea

[21] Appl. No.: 09/201,837

[22] Filed: Dec. 1, 1998

[30] Foreign Application Priority Data

Dec. 1, 1997 [KR] Rep. of Korea ............ 97-65084

[51] Int. Cl.⁷ .................. G03F 7/22; G02F 1/133
[52] U.S. Cl. .................. 430/30; 430/319; 430/312; 430/394; 349/143
[58] Field of Search ................ 430/312, 22, 30, 430/319, 313, 317, 318, 394; 349/143

[56] References Cited

U.S. PATENT DOCUMENTS

| | | | |
|---|---|---|---|
| 5,026,143 | 6/1991 | Tanaka et al. | 349/143 |
| 5,285,302 | 2/1994 | Wu | 349/43 |
| 5,298,761 | 3/1994 | Aoki et al. | 250/548 |
| 5,656,526 | 8/1997 | Inada et al. | 430/314 |
| 5,795,686 | 8/1998 | Takizawa et al. | 430/5 |
| 5,945,256 | 8/1999 | Kim et al. | 430/312 |

*Primary Examiner*—John A. McPherson
*Attorney, Agent, or Firm*—Howrey Simon Arnold & White, LLP

[57] ABSTRACT

Disclosed is a liquid crystal display. The LCD includes an active area realized through a plurality of panel shots and stitch verniers for measuring stitch errors between the panel shots. The LCD is manufactured by forming first, second and third masks, each mask having a mask shot for forming the panel shots and a plurality of vernier patterns provided on a periphery of the mask shots for forming the stitch verniers; exposing the first mask to form a first panel shot in the active area of the LCD and a plurality of stitch verniers on a periphery of the first panel shot; exposing the second mask to form a second panel shot in the active area of the LCD and a plurality of stitch verniers on a periphery of the second panel shot; exposing the third mask to form a third panel shot in the active area of the LCD and expose stitch verniers which are formed on the periphery of the first panel shot and located in an area of the active area corresponding to the third panel shot; and removing the stitch verniers exposed by the third mask and formed in the active area corresponding to the third shot.

24 Claims, 6 Drawing Sheets

LIQUID CRYSTAL DISPLAY AND A MANUFACTURING METHOD THEREOF

BACKGROUND OF THE INVENTION (a) Field of the Invention

The present invention relates to a liquid crystal display (LCD), and more particularly, to an LCD and a manufacturing method thereof that measures stitch errors between the panel shots for arrangement of the same when an LCD panel is formed by dividing the same into a plurality of shots.

(b) Description of the Prior Art

When exposing an active area (a display area) of the LCD panel in the case where the active area is larger than a mask, the active area is first divided into shots, and a step and repeat process of a stepper method is utilized. However, in the actual division of the active area into shots, a shifting, a rotation, a distortion and other flaws occur in the mask manufacturing and installation processes. This causes differences in parasitic capacitances between each line and pixel electrode in spaces between the panel shots, and differences in positions of patterns. Such differences in parasitic capacitances, in turn, result in variations in electrical characteristics of the LCD panel, while differences in positions of patterns result in discrepancies in effective aperture ratios.

In the manufacturing process of the thin film transistor (TFT) LCD—generally comprised of a plurality of layers such as a metallic layer, insulation layer, semiconductor layer, etc.—since layers, starting with a second layer, are stacked on a first layer, errors can be measured based on the first layer. However. since the first layer is not stacked on any layer, stitch verniers are provided in the LCD panel to measure errors in the first layer and the panel shots are arranged using this measured value.

Referring to FIG. 1, shown is a view illustrating a prior art LCD panel having stitch verniers. As shown in the drawing, an active area 10 of the LCD panel is divided into four shots A1, A2, A3 and A4. Dotted lines in the drawing indicate boundary lines, i.e. stitch lines, between the shots A1, A2, A3 and A4. Stitch verniers 14, for measuring misalignment of the panel shots A1, A2, A3 and A4 (stitch errors), are formed on a periphery 12 of the active area 10. Here, the disposing of the stitch verniers 14 on the periphery 12 of the active area 10, rather than within the same, is done to prevent a reduction in an effective aperture ratio of the LCD panel.

Referring now to FIG. 2, shown is a view of a prior art mask for exposing the LCD panel of FIG. 1. As shown in the drawing, the mask 20 comprises a mask shot 16 for exposing the panel shots A1, A2, A3 and A4 of the LCD panel, and vernier patterns s1, s2 s3 and s4 for exposing the stitch verniers 14 of the LCD panel. The vernier patterns s1, s2, s3 and s4 are detached at a predetermined distance (p) from the mask shot 16 such that a blind is formed to shield part of the mask 20 during exposure of the LCD panel. Without the formation of such a blind, the active area of the LCD panel is reduced.

That is, if the panel shot A1 of FIG. 1 is exposed using the mask 20 of FIG. 2 without blinding an active area of the panel shot A1, as vernier pattern s4 exposes an active portion of panel shot A4, the effective aperture ratio of the LCD panel is reduced. Accordingly, exposure is performed after the vernier pattern s4 is blinded so that the same is not exposed in the active area. For this reason, each vernier pattern s1, s2, s3 and s4 is distanced from outer boundaries of the mask shot 16 to the predetermined distance (p).

In the above, as the vernier patterns must be formed in areas where there are no patterns, such as areas corresponding to lines, a pad portion, etc., the distance between the mask shot and vernier patterns must be further increased.

However, as there is a limit to the size of the mask, the size of the mask shot becomes smaller as the distance between the same and the vernier patterns increases. As a result, the LCD panel must be divided into more numbers of mask shots for exposure such that exposure time is increased. This problem is further compounded by the fact that the blind positions must be repeatedly re-established when using the same mask for multiple exposure processes.

Further, as the stitch verniers are formed in the periphery of the active area, when a shifting, a rotation, a distortion and other flaws occur, as these defects of the peripheral portion of the active area and stitch lines do not correspond, flaws of the active area can not be precisely measured.

SUMMARY OF THE INVENTION

The present invention has been made in an effort to solve the above problems

It is an object of the present invention to provide a liquid crystal display and a manufacturing method thereof in which a size of a mask shot is made large to decrease exposure time.

It is another object of the present invention to provide a liquid crystal display and a manufacturing method thereof in which errors of an active area can be precisely measured even with the occurrence of a shifting, a rotation, a distortion and other such flaws.

To achieve the above objects, the present invention provides a liquid crystal display. The LCD includes an active area realized through a plurality of panel shots and stitch verniers for measuring stitch errors between the panel shots.

The LCD is manufactured by forming first, second and third masks, each mask having a mask shot for forming the panel shots and a plurality of vernier patterns provided on a periphery of the mask shots for forming the stitch verniers; exposing the first mask to form a first panel shot in the active area of the LCD, and to form a plurality of stitch verniers on a periphery of the first panel shot; exposing the second mask to form a second panel shot in the active area of the LCD, and to form a plurality of stitch verniers on a periphery of the second panel shot; exposing the third mask to form a third panel shot in the active area of the LCD, and to expose stitch verniers that are formed on the periphery of the first panel shot and are located in an active area corresponding to the third panel shot; and removing the stitch verniers exposed by the third mask and formed in the active area corresponding to the third shot.

BRIEF DESCRIPTION OF THE DRAWINGS

The accompanying drawings, which are incorporated in and constitute a part of the specification, illustrate an embodiment of the invention, and, together with the description, serve to explain the principles of the invention.

DESCRIPTION OF THE PREFERRED EMBODIMENTS

Preferred embodiments of the present invention will now be described in detail with reference to the accompanying drawings.

Figure 1:
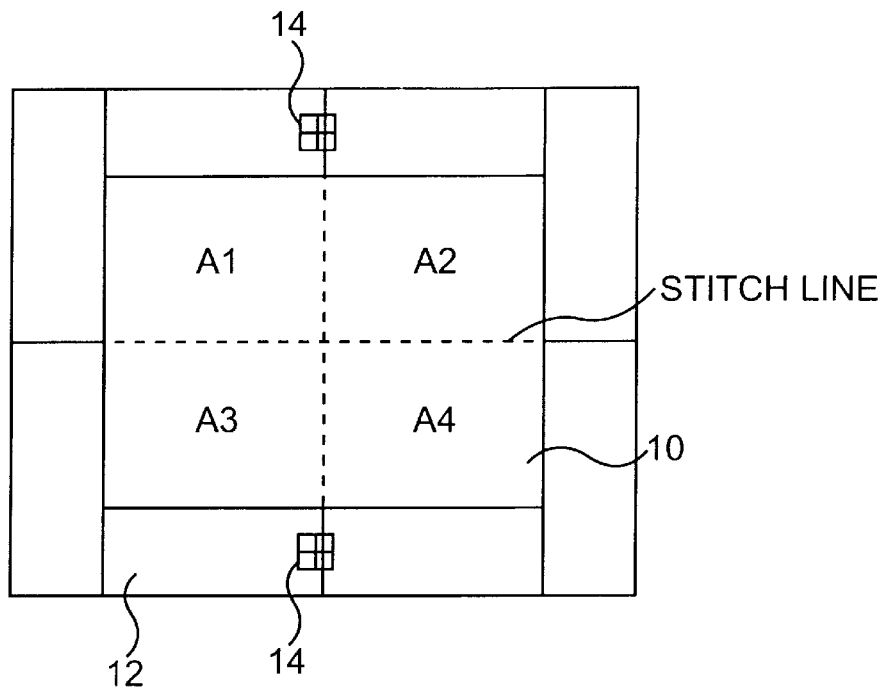
FIG. 1 is a view illustrating a prior art LCD panel having stitch verniers.
Figure 2:
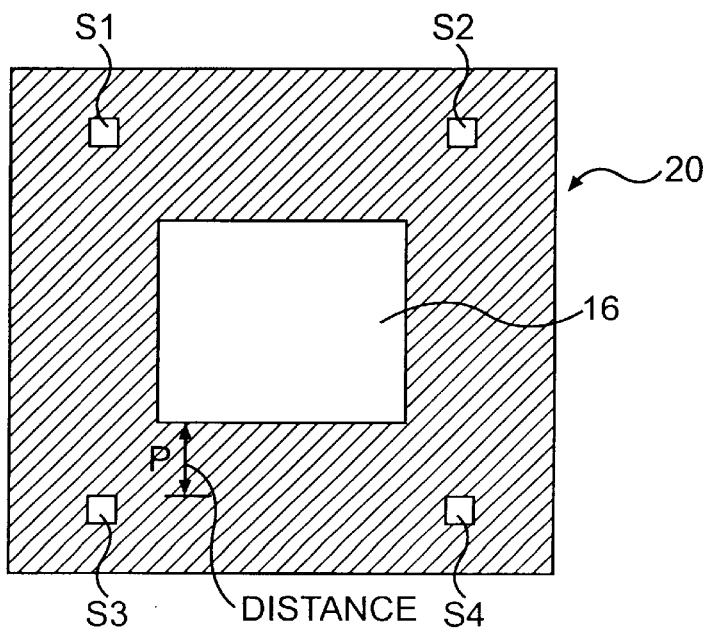
FIG. 2 is a view of a prior art mask for exposing the LCD panel of FIG. 1.
Figure 3:
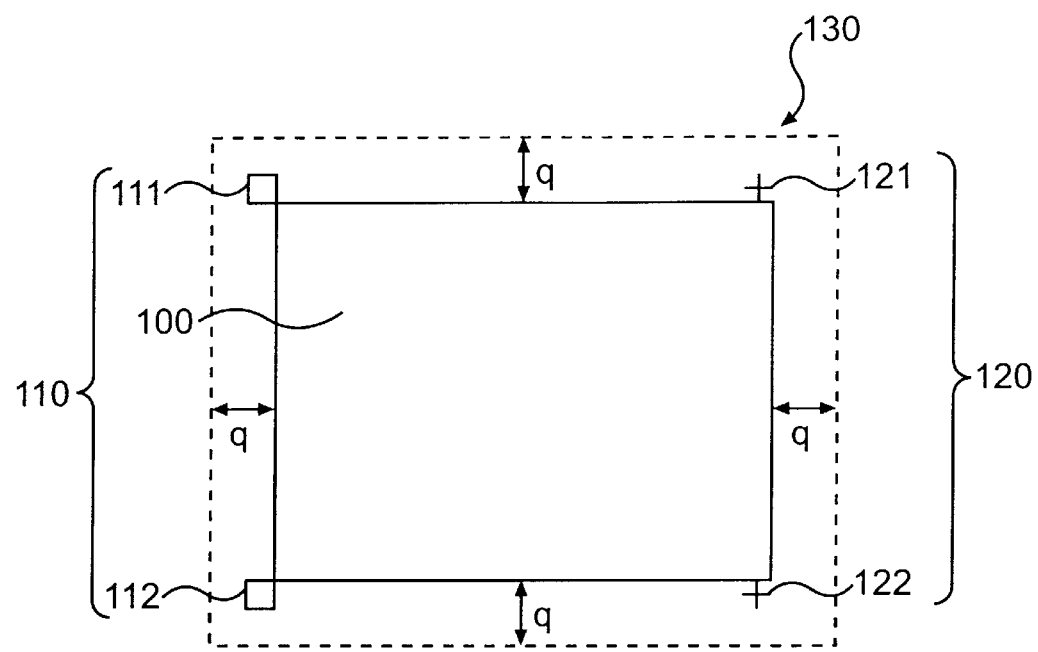
FIG. 3 is a view illustrating a mask on which vernier patterns are formed according to a first preferred embodiment of the present invention.

Referring first to FIG. 3, shown is a view illustrating a mask on which vernier patterns are formed according to a first preferred embodiment of the present invention. As shown in the drawing, the mask 130 comprises a mask shot 100 for exposing an LCD panel, and female and male vernier pattern sets 110 and 120, respectively.

The female vernier pattern set 110 includes first and second female vernier patterns 111 and 112, provided outside the mask shot 100 and respectively formed on upper and lower corners of it. The male vernier pattern set 120 includes first and second male vernier patterns 121 and 122, provided outside the mask shot 100 and respectively formed on upper and lower corners of it. The first female vernier pattern 111 and the second female vernier pattern 112 are indicated by square symbols, while the first male vernier pattern 121 and the second male vernier pattern 122 are indicated by positive (+) signs. Using the mask 130 of the present invention, as it is possible to conduct the exposure process without shielding the vernier patterns 111, 112, 121 and 122 with a blind as in the prior art, it is possible to form the mask shot 100 within only a minimal predetermined distance (q) from an outer circumference of the mask 130.

In the present invention, the vernier patterns 111, 112, 121 and 122 are positioned at a distance of five or less pixel-lengths (here, pixels refer to quadrilateral areas defined by data lines and gate lines of the LCD panel) from the mask shot 100. A size of the mask shot 100 increases as the distance of the vernier patterns 111, 112, 121 and 122 from the same is reduced. It is preferable for the vernier patterns 111, 112, 121 and 122 to be distanced from the mask shot 100 by a distance of one pixel or less.

Figure 4:
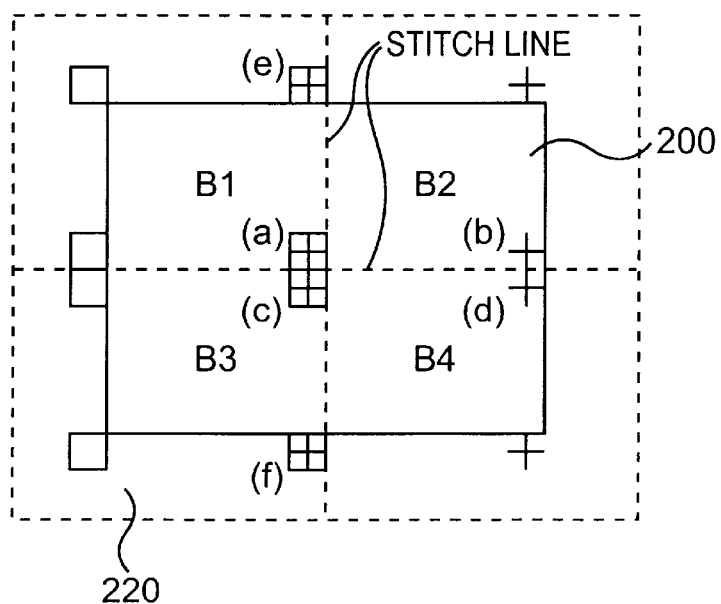
FIG. 4 is a view illustrating a liquid crystal display panel repeatedly exposed using the mask shown in FIG. 3.

FIG. 4 is a view illustrating a liquid crystal display panel repeatedly exposed using the mask shown in FIG. 3. As shown in the drawing, an active area 200 of the LCD panel is divided into four panel shots B1, B2, B3 and B4 and the active area 200 is repeatedly exposed by the mask 130 of FIG. 3 to form the panel shots B1, B2, B3 and B4. Further, a peripheral area 220 is formed around the active area 200 of the LCD panel.

The exposure of the LCD panel structured as in the above will be described hereinafter.

First, an upper, left portion of the LCD panel is exposed using the mask 130 of FIG. 3. That is, the mask shot 100 of the mask 130 is exposed in the upper, left portion of the LCD panel to form the panel shot B1 of the LCD panel, and the vernier patterns 111, 112, 121 and 122 of the mask 130 are exposed in peripheral areas of the panel shot B1. Here, the first and second female vernier patterns 111 and 112, and the first male vernier pattern 121 are exposed in the peripheral area 220 outside the active area 200, while the second male vernier pattern 122 is exposed in a location (c), positioned under and to a far right side of the panel shot B1.

Next, an upper, right portion of the LCD panel is exposed using the mask 130. That is, the mask shot 100 of the mask 130 is exposed in the upper, right portion of the LCD panel to form the panel shot B2 of the LCD panel, and the vernier panels 111, 112, 121 and 122 of the mask 130 are exposed in peripheral areas of the panel shot B2. Here, a location (e), above and to a left of the panel shot B2, is exposed by the first female vernier pattern 11 to overlap that already exposed by the first male vernier pattern 121 during the exposure process of the panel shot B1. Also, the second female vernier pattern 112 and the second male vernier pattern 122 expose the location (c) and a location (d), respectively.

Subsequently, the panel shot B3 and the panel shot B4 of the LCD panel are exposed using the mask 130. Accordingly, locations (a), (b), (c) and (d) within the active area 200 of the LCD panel are exposed, and a location (f) provided under and to a left of the panel shot B4 is exposed.

The locations (a), (b), (c) and (d) exposed by the vernier patterns 111, 112, 121 and 122 of the mask 130 are removed during the formation of adjacent panel shots. That is, when the vernier pattern of the location (a) is exposed during the third and fourth exposures (the panel shots B3 and B4), as light was already illuminated on the location (a) during the exposure of the panel shot B1 during the first exposure (it is assumed that no metallic pattern is formed on the location (a)), a photo resister is removed from the location (a) during an etching process. Accordingly, no pattern is formed on the location (a). Similarly, a photo resister is removed from the remaining locations (b), (c) and (d) during the etching process such that no pattern is formed thereon.

As described in the above, as the locations (a), (b), (c) and (d) exposed by the vernier patterns 111, 112, 121 and 122 of the mask 130 are removed by exposure of the panel shots, stitch verniers are formed in the peripheral area 220 outside the active area 200 of the LCD panel. Here, as only the locations (e) and (f), adjacent to stitch lines, are repeatedly exposed by the vernier patterns 111, 112, 121 and 122, female and male stitch verniers, which are patterns formed on the LCD panel by exposure of the female and male vernier patterns 111, 112, 121 and 122, are used to measure errors between the panel shots.

In order to remove the locations exposed by the vernier patterns by the exposure of the panel shots, the stitch verniers, formed by the exposure of the vernier patterns, must be formed in areas where patterns of gate lines and electrodes are not formed.

Figure 5:
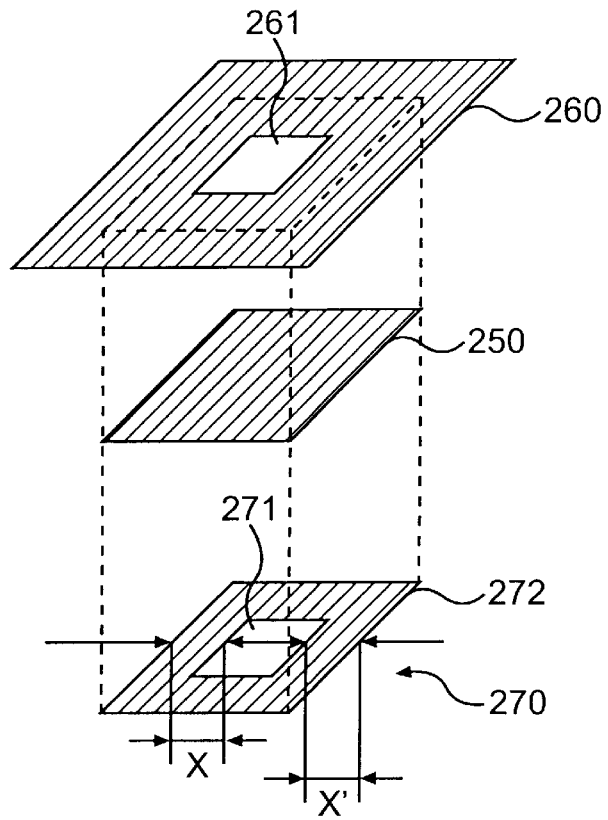
FIG. 5 is a view used to describe a method of measuring errors between panel shots using female stitch verniers and male stitch verniers.

Referring now to FIG. 5, shown is a view used to describe a method of measuring errors between panel shots using female stitch verniers and male stitch verniers. In the drawing, elements 250 and 260 are enlarged views of the first male vernier pattern 121 and the first female vernier pattern 111, respectively, of FIG. 3, and element 270 is an enlarged view of the location (e) of FIG. 4.

The first male vernier pattern 250 blocks all light, while the first female vernier pattern 260 blocks all light except for a center segment 261. The center segment 261 of the first female vernier pattern 260 enables the transmission of light therethrough. The first female vernier pattern 260 and the first male vernier pattern 250 are exposed on the same location of the LCD panel to measure stitch errors between the panel shots as described below.

The first female vernier pattern 260 and the first male vernier pattern 250 are established on the mask 130 of FIG. 3 as fellows. When a first exposure portion 271 of the LCD panel, exposed by the transmission of light through the center segment 261 of the first female vernier pattern 260, is positioned at an exact center of a second exposure portion 272 of the LCD panel (i.e. where X=X'), exposed by the first male vernier pattern 250, this indicates an exact arrangement between adjacent panel shots.

Next, values of X and X' are measured after the first female vernier pattern 260 and the first male vernier pattern 250 are exposed on the LCD panel. Here, unequal values of X and X' indicate a stitch error between adjacent panel shots, and a value of the error is measured by the difference in the values X and X'.

According to the first preferred embodiment of the present invention, as repeated exposure is performed using the mask shot formed within the outer circumference of the mask at a minimal predetermined distance, the distance separating the vernier patterns and the mask shot can be small, thereby enlarging the size of the mask shot. Accordingly, during the exposure of the LCD panel, the number of mask shots is reduced such that overall exposure time is decreased. A reduction in the exposure time is further realized by the fact that exposure is conducted without the establishment of a blind (and subsequent multiple re-settings of the same) as in the prior art.

However, in the first embodiment, as the vernier patterns are formed outside of the active area of the LCD panel, if a shifting, a rotation, a distortion and other flaws occur in the mask manufacturing and installation processes, flaws in the peripheral area does not correspond to the stitch lines of the LCD panel. As a result, errors between adjacent panel shots can not be precisely measured by the stitch verniers of the peripheral area. To overcome the above limitation, a stitch pattern is provided in an active area of an LCD panel to correct errors between adjacent panel shots.

Figure 6:
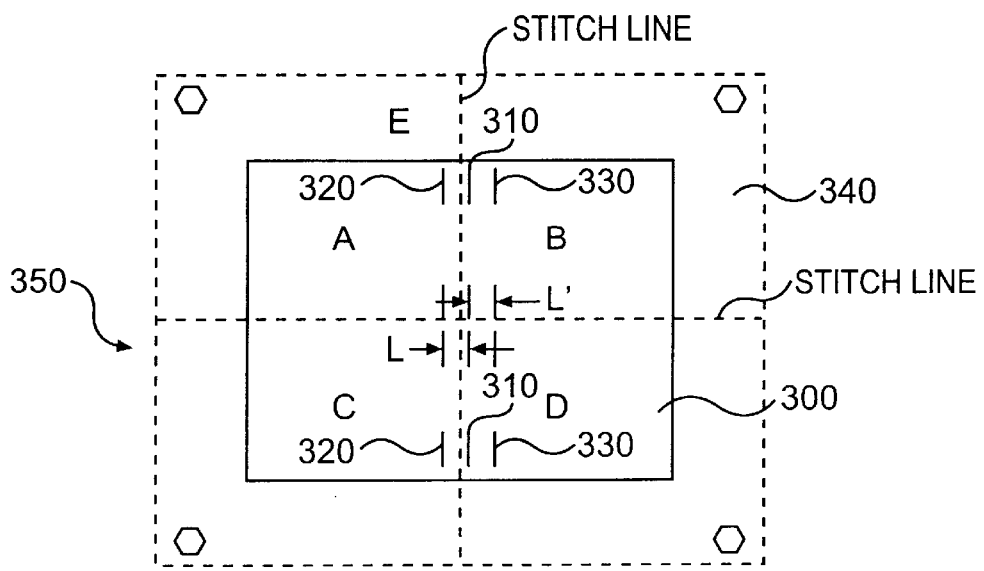
FIG. 6 is a view illustrating a liquid crystal display panel having a stitch pattern according to a second preferred embodiment of the present invention.

FIG. 6 is a view illustrating a liquid crystal display panel having a stitch pattern according to a second preferred embodiment of the present invention.

As shown in the drawing, the LCD panel 350 is divided into an active area 300 and a peripheral area 340, and the active area 300 is separated into four panel shots A, B, C and D. The panel shots A, B, C and 0 are formed respectively in an upper-left, upper-right, lower-left and lower-right section of the active area 300, and the panel shots A, B, C and D are separated by a vertical and a horizontal stitch line. That is, the vertical stitch line separates the panel shot A from the panel shot B, and the panel C from the panel shot D; and the horizontal stitch line separates the panel shot A from the panel shot C, and the panel shot B from the panel shot D.

In addition, first patterns 320 are formed adjacent to the vertical stitch line in the panel shots A and C, second patterns 330 are formed in the panel shots B and D at a predetermined distance from the vertical stitch line, and stitch patterns 310 are formed between the first and second patterns 320 and 330 in the panel shots B and D. In FIG. 6, although the stitch patterns 310 are provided in the panel shots B and D, it is also possible to form the stitch patterns 310 in the panel shots A and C.

In the above, a distance L between the first patterns 320 and the stitch patterns 310, and a distance L' between the second patterns 330 and the stitch patterns 310 are identical. That is, when no stitch error has occurred, the distance L equals to the distance L'.

However, it is determined that a stitch error did occur when the distance L does not equal to the distance L'. Accordingly, if the distance L is larger than the distance L', as this indicates that the panel shots B and D are positioned too far to the right to as much as the difference between the distance L and the distance L', the the panel shots B and D are exposed by moving the mask for exposing the LCD panel 350 to the left to the extent of the resulting value of L–L'.

In the above, it is preferable to form at least two of each of the patterns in each panel shot such that stitch errors can be precisely measured.

Figure 7:
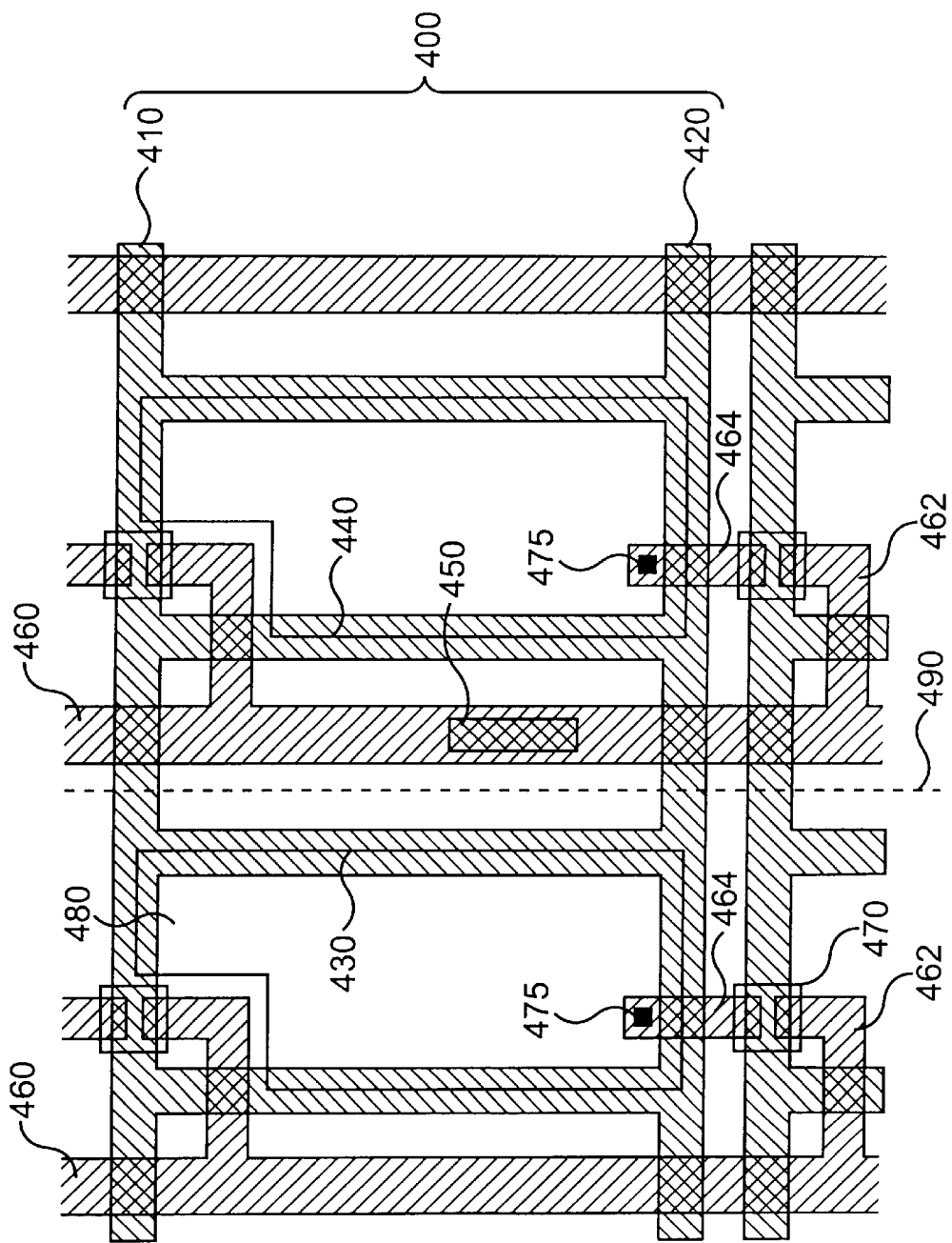
FIG. 7 is a view illustrating an example of a pixel structure according to a second preferred embodiment of the present invention.
Figure 8:
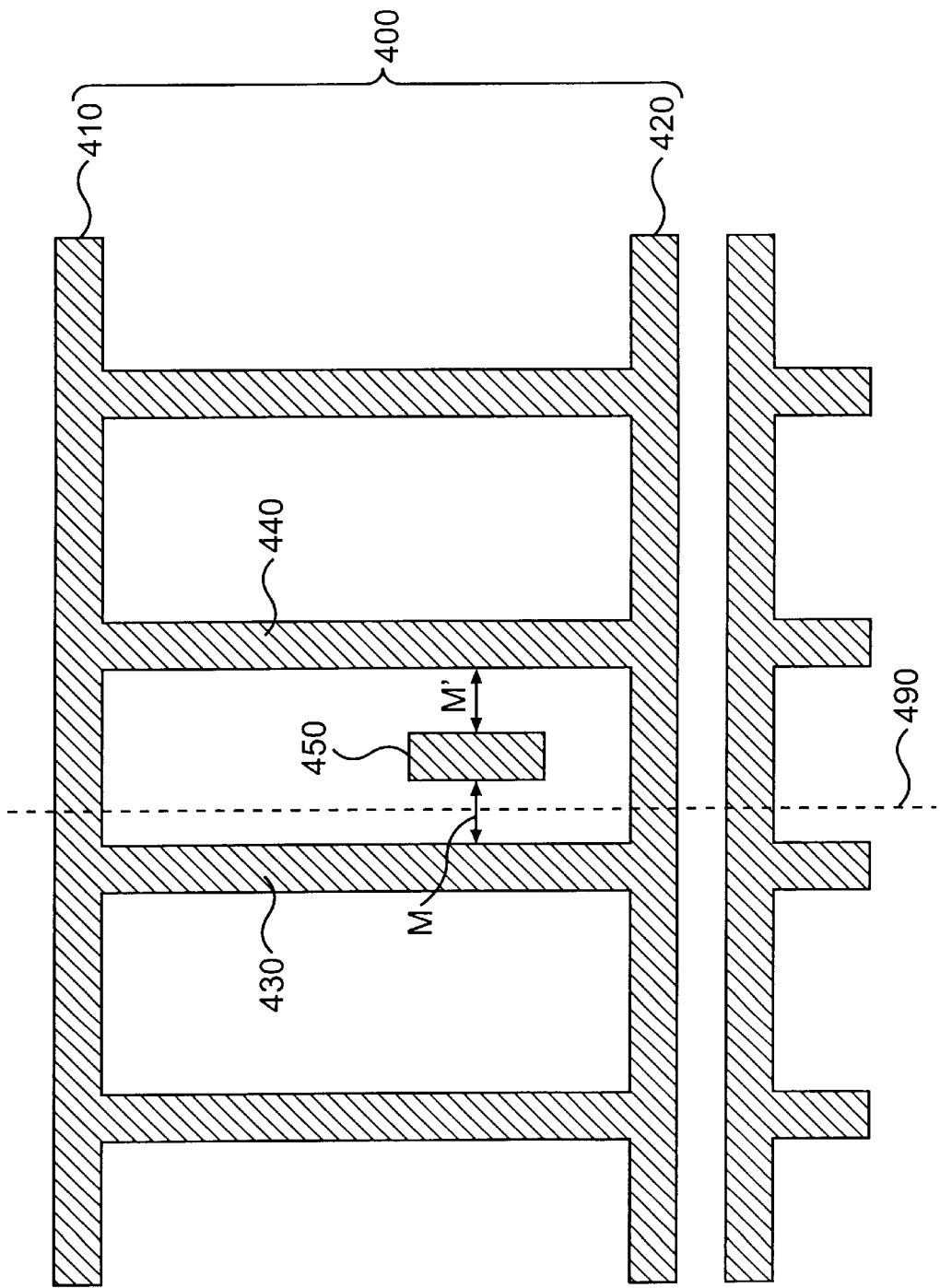
FIG. 8 is a view illustrating a pattern of a first layer pattern of the pixel structure shown in FIG. 7.

Referring now to FIGS. 7 and 8, shown respectively are a view illustrating an example of a pixel structure according to a second preferred embodiment of the present invention, and a view illustrating a pattern of a first layer of the pixel structure shown in FIG. 7.

The first layer of the pixel structure comprises gate lines 400 including a first gate line 410 and a second gate line 420, and a first connecting portion 430 and a second connecting portion 440 formed between the first and second gate lines 410 and 420 and connecting the same. Provided between the first and second connecting portions 430 and 440 is a stitch pattern 450. Here, a distance M between the first connecting portion 430 and the stitch pattern 450 is equal to a distance M' between the second connecting portion 440 and the stitch pattern 450. Further, a stitch line 490, which is a boundary line between adjacent panel shots, is positioned between the first connecting portion 430 and the stitch pattern 450.

An insulation layer (not shown) is formed on the first layer, and semiconductor layers (not shown) are provided on the insulation layer formed on gate electrodes (gate insulation layer) and are formed centering around both sides of the gate electrodes, the gate electrodes forming part of the first gate line 410.

As shown in FIG. 7, data lines 460 are formed on the gate insulation layer and are parallel to the first and second connecting portions 430 and 440. One of the data lines 460 covers the stitch pattern 450. Branched from the data lines 460 are source electrodes 462 formed over one of the semiconductor layers, and formed over the other semiconductor layer are drain electrodes 464. The gate electrodes, source electrodes 462, drain electrodes 464 and semiconductor layers comprise thin film transistors (TFTs) 470.

A protection layer (not shown) is formed on top of the data lines 460 and the TFTs 470, and contact holes 475 are formed in the protection layer for the exposure of the drain electrodes 464. Pixel electrodes 480 made of indium tin oxide are provided on top of the protection layer, and contacts the drain electrodes 464 via the contact holes 475.

Stitch errors of the first layer of the LCD panel structured as shown in FIG. 8 are measured identically as previously described. That is, after exposing the first layer, if the distance M is not equal to the distance M', it is determined that a stitch error has occurred, and the stitch error value is the difference between the distances M and M'. Accordingly, this value is used to correct the error by making adjustments with the mask during exposure such that the panel shots of the LCD panel can be precisely arranged. In FIG. 7. as the stitch pattern 450 is formed where one of the data lines 460 is provided, parasitic capacitance influence by the stitch pattern 450 can be reduced.

Figure 9:
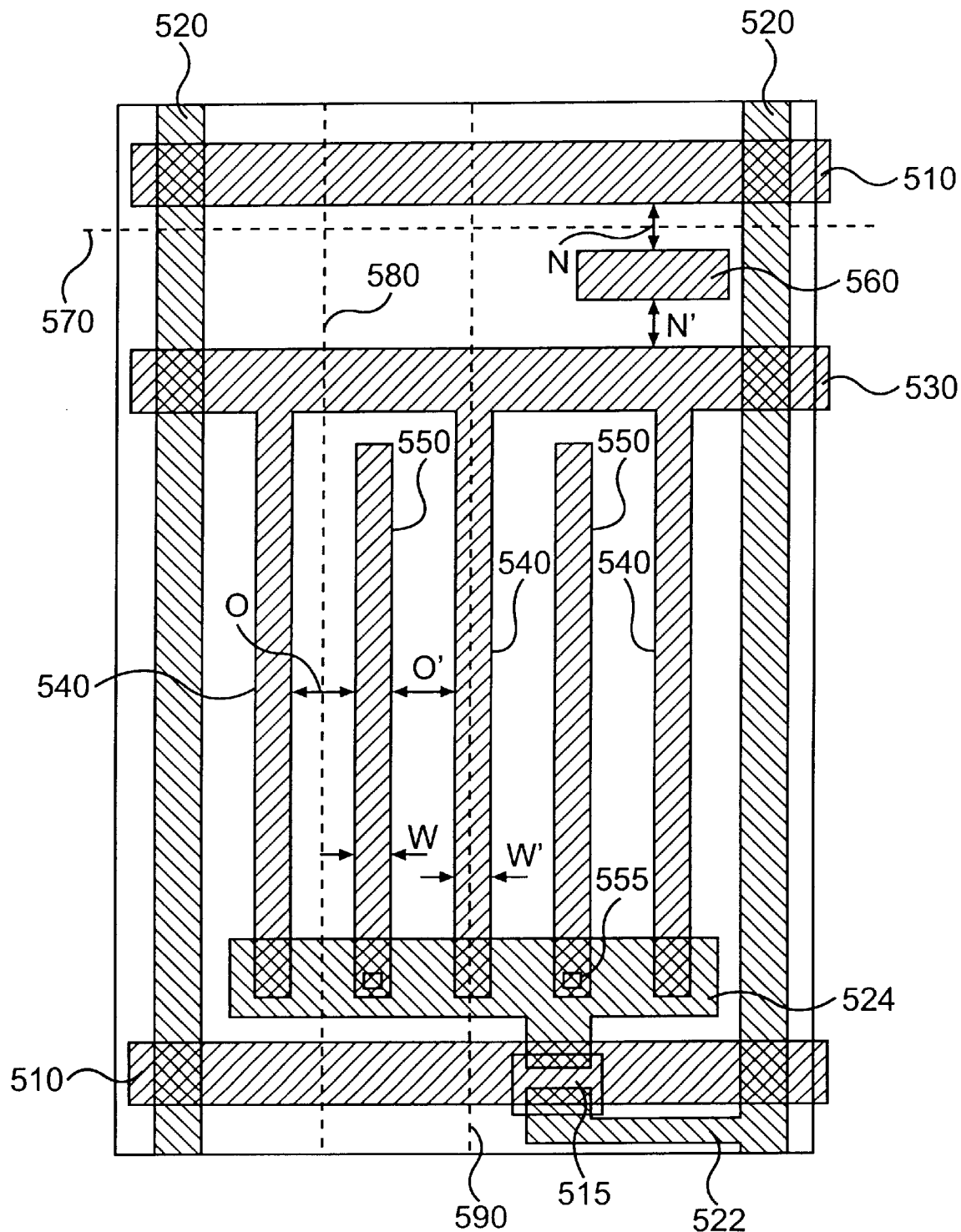
FIG. 9 is a view illustrating an example of a pixel structure applying an IPS mode according to a second preferred embodiment of the present invention.

FIG. 9 is a view illustrating an example of a pixel structure applying an in-plane switching (IPS) mode where pixel electrodes and common electrodes are provided on the same substrate according to the second preferred embodiment of the present invention.

In the drawing, the pixel structure includes horizontal gate lines 510 and a common line 530 disposed parallel to the horizontal gate lines 510. A plurality of common electrodes 540 are connected to the common line 530, the common electrodes 540 being formed perpendicular to the common line 530, and pixel electrodes 550 are formed between the common electrodes 540. Distances O and O' between the pixel electrodes 550 and adjacent common electrodes 540 are equal, and widths W and W' of the pixel electrodes 550 and the common electrodes 540 are identical.

A stitch pattern 560 is interposed between the common line 530 and the upper gate line 510. A distance N between the gate line 510 and the stitch pattern 560 is equal to a distance N' between the common line 530 and the stitch pattern 560. A stitch line 570 is positioned between the gate line 510 and the stitch pattern 530. Here, the gate line 510, common electrode 540, pixel electrode 550, common line 530 and stitch pattern 560 are all formed on a first layer of the pixel structure. An insulation layer (not shown) is formed on the first layer, and contact holes 555 are formed at each of the pixel electrodes 550 for exposing the same.

Further, semiconductor layers (not shown) are provided on the insulation layer, the semiconductor layers being formed centering around and on both sides of gate electrodes (not shown) of the gate lines 510. Data lines 620 are formed on top of the gate insulation layer, the data lines 520 being parallel to the common electrodes 540 and the pixel electrodes 550. Branched from the data lines 520 are source electrodes 522 formed over one of the semiconductor layers, and provided over the other semiconductor layers are drain electrodes 524. The gate electrodes, source electrodes 522, drain electrodes 524 and semiconductor layers comprise thin film transistors (TFTs) 515.

Errors between adjacent panel shots in the IPS mode pixel electrode structure above are measured using the following method.

First, with vertically-adjacent panel shots, errors are measured by comparing the distances N and N' like the method used in the panel structure of FIG. 7.

However, in the case of horizontally-adjacent panel shots, the following two methods are used to measure errors.

In the first method, a first vertical stitch line 580 is positioned between one pixel electrode 550 and one common electrode 540. As the pixel structure of FIG. 9 is designed such that the distances O and O' between the pixel electrodes 550 and the adjacent common electrodes 540 are equal, stitch errors are measured by the difference in the distance O and O'.

According to the second method, a second vertical stitch line 590 is positioned running along the middle of one of the common electrodes 540 (or one of the pixel electrodes 550). In FIG. 9, as the widths W and W' of the pixel electrodes 550 and the common electrodes 540, respectively, are designed to be equal, the width W' of the common electrode 540, the middle of which the second vertical stitch line 590 is formed, must be equal to the width W of the pixel electrode 550, through which a stitch line is not formed. Accordingly, a difference between the width W and the width W' after adjacent panel shots have been exposed is indicative of stitch errors, and the degree of the error is determined by subtracting the two widths W and W'.

In the LCD panel of the second embodiment, stitch errors can be precisely measured using the stitch patterns formed in the active area of the LCD panel even when a shifting, a rotation, a distortion and other flaws occur in the mask manufacturing and installation processes.

In the present invention, as the distance separating the vernier patterns and the mask shot is made small, the size of the mask shot can be enlarged such that the total number of exposure is reduced, thereby decreasing the overall exposure time. This advantage is further realized by the fact that the stitch verniers are exposed without the establishment of a blind.

In addition, as the stitch patterns are formed in the active area of the LCD panel, stitch errors can be precisely measured even when a shifting, a rotation, a distortion and other flaws occur in the mask manufacturing and installation processes.

While this invention has been described in connection with what is presently considered to be the most practical and preferred embodiment, it is to be understood that the invention is not limited to the disclosed embodiments, but, on the contrary, is intended to cover various modifications and equivalent arrangements included within the spirit and scope of the appended claims

What is claimed is:

1. A manufacturing method of a liquid crystal display, an active area of the liquid crystal display including a first panel shot and a second panel shot, comprising the steps of:
    forming first patterns in the first panel shot, the first patterns being provided parallel to a stitch line acting as a boundary between the first and second panel shots;
    forming second patterns in the second panel shot, the second patterns being parallel to the stitch line;
    forming stitch patterns between the first and second patterns, the stitch patterns being parallel to the stitch line; and
    measuring stitch errors of the first and second panel shots by comparing a distance between the first patterns and the stitch patterns with a distance between the second patterns and the stitch patterns.

2. The manufacturing method of claim 1, wherein the distance between the first patterns and the stitch patterns is the same as [identical with] the distance between the second patterns and the stitch patterns.

3. The manufacturing method of claim 2, wherein the stitch error between the first and second panel shots is measured by the difference between the distance between the first patterns and the stitch patterns and the distance between the second patterns and the stitch patterns.

4. A liquid crystal display having an active area including a first panel shot and a second panel shot, comprising:
    first patterns formed in the first panel shot, the first patterns being provided parallel to a stitch line acting as a boundary between the first and second panel shots;
    second patterns formed in the second panel shot, the second patterns being parallel to the stitch line; and
    stitch patterns formed between the first and second patterns, the stitch patterns being parallel to the stitch line.

5. The LCD of claim 4, wherein a distance between the first patterns and the stitch patterns is the same as a distance between the second patterns and the stitch patterns.

6. The LCD of claim 5, wherein the active area is formed by a plurality of overlapping layers, and the first pattern the second pattern and the stitch pattern are formed on an identical layer.

7. The LCD of claim 6, wherein the first pattern, the second pattern and the stitch pattern are formed on a first layer.

8. The LCD of claim 5, wherein at least two of each of the first pattern, the second pattern and the stitch pattern are formed in each panel shot.

9. A liquid crystal display having an active area including a plurality of panel shots including a first panel shot and a second panel shot, comprising:

gate lines;

a first connecting portion formed in the first panel shot and between the gate lines, the first connecting portion being perpendicular to the gate lines and connecting the same;

a second connecting portion formed in the second panel shot and parallel to the first connecting portion, the second connecting portion connecting the gate lines; and a stitch pattern provided between the first and second connecting portions, the stitch pattern being used to measure a stitch error between the first and second panel shots.

10. The LCD of claim 9, wherein the gate lines includes a first gate line and a second gate line disposed parallel to the first gate line, and the first and second connecting portions are formed between the first and second gate lines connecting the same.

11. The LCD of claim 9, wherein a distance between the first connecting portion and the stitch pattern is equal to a distance between the second connecting portion and the stitch pattern.

12. The LCD of claim 11, wherein the active area is comprised of a plurality of layers, and the gate lines, the first connecting portion, the second connecting portion and the stitch pattern are formed on a same layer.

13. The LCD of claim 12, further comprising a data line formed on a different layer from the stitch pattern, the data line covering the stitch pattern.

14. A liquid crystal display having an active area including a first panel shot and a second panel shot, comprising:

gate lines formed in the first panel shot and parallel to a stitch line, the stitch line acting as a boundary line between the first and second panel shots;

a common line formed in the second panel shot and parallel to the stitch line;

a stitch pattern formed between the common line and the gate line, disposed adjacent to the stitch line, the stitch pattern being used to measure a stitch error between the first and second panel shots;

first and second common electrodes connected to the common line and perpendicular to the same; and a pixel electrode formed between the first and second common electrodes.

15. The LCD of claim 14, wherein a distance between the gate line and the stitch pattern is equal to a distance between the common line and the stitch pattern.

16. The LCD of claim 14, wherein a distance between the first common electrode and the pixel electrode is equal to a distance between the second common electrode and the pixel electrode.

17. The LCD of claim 14, wherein a width of the pixel electrode is equal to widths of the first and second common electrodes.

18. The LCD of claim 17, wherein the active area is comprised of a plurality of layers, and the gate lines, the common line, the common electrodes, the pixel electrode and the stitch pattern are formed on a same layer.

19. A manufacturing method of a liquid crystal display, an active area of the liquid crystal display being divided into a plurality of panel shots including a first panel shot and a second panel shot, comprising the steps of:

forming gate lines parallel to a stitch line in a first panel shot, the stitch line acting as a boundary line between a first panel shot and a second panel shot;

forming a common line in the second panel shot and parallel to the stitch line in the second panel shot;

forming a stitch pattern between the common line and the gate line, disposed adjacent to the stitch line, the stitch pattern being parallel to the stitch line;

forming a first common electrode and a second common electrode connected to the common line and perpendicular to the same;

forming a pixel electrode between the first common electrode and a second common electrode; and measuring a stitch error between the first panel shot and a second panel shot by comparing a distance between the gate line and the stitch pattern and a distance between the common line and the stitch pattern.

20. The method of claim 19, wherein the distance between the gate line and the stitch pattern is equal to the distance between the common line and the stitch pattern.

21. The method of claim 20, wherein the stitch error between the first panel and the second panel shot is determined as a difference of the distance between the gate line and the stitch pattern, and the distance between the common line and the stitch pattern.

22. The method of claim 19, wherein the first common electrode and the pixel electrode are formed by a third panel shot, the second common electrode is formed by a fourth panel shot, and a stitch line is formed between the pixel electrode and the second common electrode and parallel to the same, the stitch line acting as a boundary line between the third panel shot and the fourth panel shot.

23. The method of claim 22, wherein a distance between a first common electrode and the pixel electrode is equal lo a distance between the second common electrode and the pixel electrode.

24. The method of claim 13, wherein the stitch error between the third panel shot and the fourth panel shot is determined as a difference of the distance between the first common electrode and the pixel electrode and the distance between the second common electrode and the pixel electrode.

* * * * *